(12) United States Patent
Kiyohara

(10) Patent No.: US 7,755,416 B2
(45) Date of Patent: Jul. 13, 2010

(54) TEMPERATURE-SENSOR CIRCUIT, AND TEMPERATURE COMPENSATED PIEZOELECTRIC OSCILLATOR

(75) Inventor: Atsushi Kiyohara, Chigasaki (JP)

(73) Assignee: Epson Toyocom Corporation (JP)

( * ) Notice: Subject to any disclaimer, the term of this patent is extended or adjusted under 35 U.S.C. 154(b) by 0 days.

(21) Appl. No.: 12/243,991

(22) Filed: Oct. 2, 2008

(65) Prior Publication Data
US 2009/0091373 A1 Apr. 9, 2009

(30) Foreign Application Priority Data
Oct. 5, 2007 (JP) .............................. 2007-261655

(51) Int. Cl.
*H01L 35/00* (2006.01)
(52) U.S. Cl. ...................... 327/512; 327/538
(58) Field of Classification Search ................. 327/512, 327/513
See application file for complete search history.

(56) References Cited

U.S. PATENT DOCUMENTS

| | | | | |
|---|---|---|---|---|
| 3,781,648 A * | 12/1973 | Owens | ........................ | 323/313 |
| 3,831,040 A * | 8/1974 | Nanba et al. | ................. | 327/512 |
| 4,114,053 A * | 9/1978 | Turner | ......................... | 327/513 |
| 4,138,616 A * | 2/1979 | Turner | ......................... | 327/512 |
| 4,622,476 A * | 11/1986 | Venkatesh | .................... | 327/513 |
| 4,644,257 A * | 2/1987 | Bohme et al. | ................ | 323/313 |
| 5,070,322 A * | 12/1991 | Fujihira | ...................... | 340/653 |
| 5,691,671 A * | 11/1997 | Bushman | .................... | 331/158 |
| 6,972,615 B2 * | 12/2005 | Rashid | ........................ | 327/538 |
| 7,170,275 B1 * | 1/2007 | Falik | .......................... | 324/71.5 |
| 7,436,242 B1 * | 10/2008 | Nosker | ........................ | 327/538 |
| 7,446,599 B1 * | 11/2008 | Wang | .......................... | 327/539 |
| 7,515,008 B2 * | 4/2009 | Ide | .............................. | 331/176 |

FOREIGN PATENT DOCUMENTS

JP 6-276020 9/1994

* cited by examiner

*Primary Examiner*—Lincoln Donovan
*Assistant Examiner*—Thomas J Hiltunen
(74) *Attorney, Agent, or Firm*—Harness, Dickey & Pierce, P.L.C.

(57) ABSTRACT

A temperature-sensor circuit includes: a transistor having an emitter that is grounded, a collector, and a base; a first resistor having a first end and a second end, the first end being coupled with the collector; and a second resistor having a third end and a fourth end, the third end being coupled with the second end of the first resistor. A junction joining the first resistor and the second resistor is coupled with the base.

6 Claims, 6 Drawing Sheets

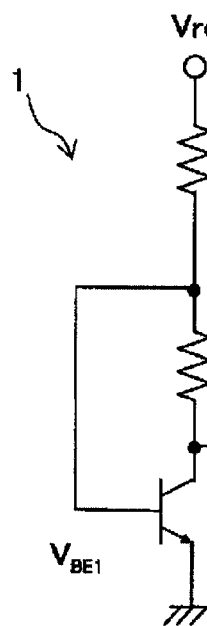
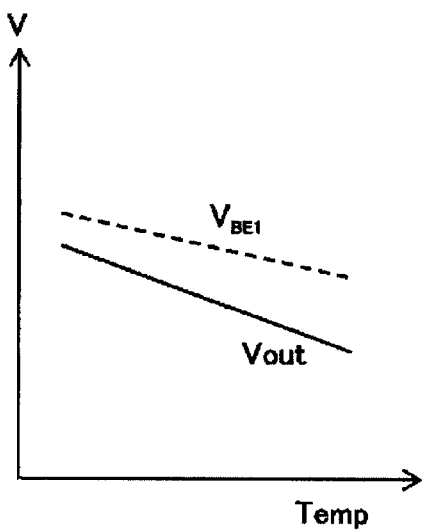
FIG. 1A    FIG. 1B
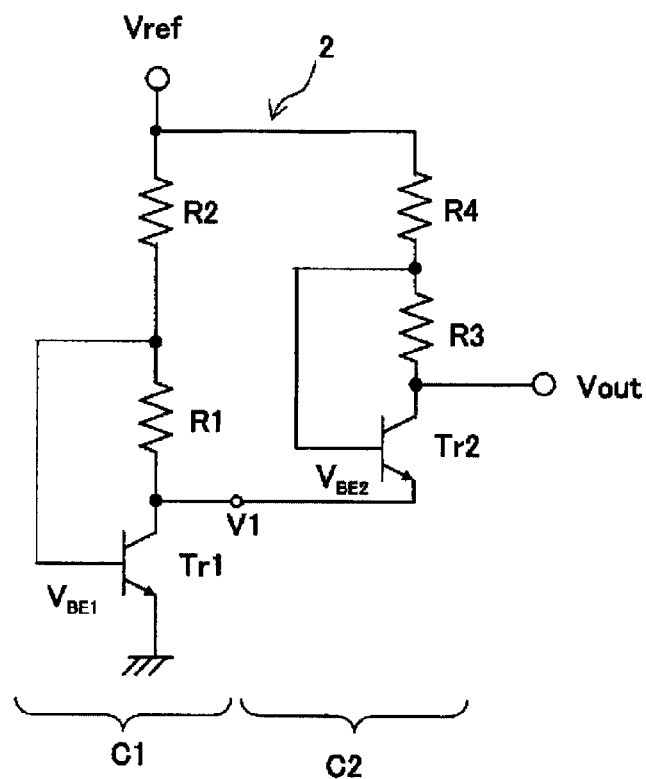
FIG. 2

TEMPERATURE-SENSOR CIRCUIT, AND TEMPERATURE COMPENSATED PIEZOELECTRIC OSCILLATOR

BACKGROUND

1. Technical Field

The present invention relates to a temperature-sensor circuit that can operate with a particularly low voltage and is superior in voltage sensitivity with respect to a temperature, and a temperature compensated piezoelectric oscillator using the same.

2. Related Art

In recent years, a piezoelectric oscillator is used in many fields from communication device such as cellular phones to commercial-off-the-shelf devices such as a quartz-crystal clock due to its high frequency stability, compact size and lightweight, low cost, and the like. In particular, a temperature compensated piezoelectric oscillator (TCXO) compensating a frequency temperature characteristic of a piezoelectric resonator is widely used in cellular phones and the like that require frequency stability.

JP-A-6-276020 discloses a temperature compensated crystal oscillator provided with a voltage generating circuit generating a desired voltage based on a temperature sensor. The temperature sensor is, as shown in FIG. 9A, configured so that one of end portions of a circuit including a plurality of diodes D1, D2, D3, ..., Dn coupled in series is grounded and the other one of the end portions is coupled with a power supply Vcc through a resistor R51. A junction joining an anode of the diode D1 and the resistor R51 in the temperature sensor is defined as an output OUT so as to obtain an output voltage from there. This makes use of variation of a potential difference at a junction of diodes with respect to a temperature change. That is, when a direct-current voltage is applied to one end of the resistor R51, a voltage variation corresponding to the temperature change can be taken from the output OUT. As shown in FIG. 9A, if n number of diodes are coupled in series, sensitivity of the output voltage with respect to the temperature becomes n times more than that of one diode, providing a voltage nearly proportional to the temperature as shown in FIG. 9B.

Further, as shown in FIG. 9C, a temperature sensor in which a terminal of a resistor R53 in a series circuit coupling a thermistor TH and the resistor R53 is grounded, and the other terminal of the thermistor TH is coupled with a power supply Vcc through a resistor R52 is disclosed. This makes use of variation of a resistance value of the thermistor with respect to a temperature. A junction joining the thermistor TH and the resistor R52 is defined as an output OUT so as to obtain an output voltage from there.

However, in the temperature sensor using diodes as a temperature-sensitive element as shown in FIG. 9A, the diodes are coupled in a multistage manner, thereby increasing a power supply voltage Vcc. Therefore, the temperature sensor is not suitable for satisfying a recent requirement for a low voltage. Further, the temperature sensor using the thermistor TH as a temperature-sensitive element as shown in FIG. 9C has a problem in that linearity of the output voltage with respect to the temperature is unfavorable. Further, as shown in FIG. 9D, the temperature sensor using one diode as a temperature-sensitive element and amplifying an output voltage with an amplifier has a problem in that a noise generating from the amplifier affects an output of a temperature compensated piezoelectric oscillator.

SUMMARY

An advantage of the invention is to provide a temperature-sensor circuit enabling voltage reduction while having less noise, and a temperature compensated piezoelectric oscillator using the same.

A temperature-sensor circuit according to a first aspect of the invention includes: a transistor having an emitter that is grounded, a collector, and a base; a first resistor having a first end and a second end, the first end being coupled with the collector; and a second resistor having a third end and a fourth end, the third end being coupled with the second end of the first resistor. A junction joining the first resistor and the second resistor is coupled with the base.

This configuration has an advantage to provide a temperature-sensor circuit enabling voltage reduction while having less noise resulting from using a transistor as a diode.

A temperature-sensor circuit according to a second aspect of the invention includes: a first transistor having a first emitter that is grounded, a first collector, and a first base; a first resistor having a first end and a second end, the first end being coupled with the first collector; a second resistor having a third end and a fourth end, the third end being coupled with the second end of the first resistor; a second transistor having a second emitter that is coupled with the first collector, a second collector, and a second base; a third resistor having a fifth end and a sixth end, the fifth end being coupled with the second collector; a fourth resistor having a seventh end and an eighth end, the seventh end being coupled with the sixth end of the third resistor. A junction of the first resistor and the second resistor is coupled with the first base, while a junction of the third resistor and the fourth resistor is coupled with the second base, and the fourth end of the second resistor is coupled with the eighth end of the fourth resistor.

This can lead an effect to provide a temperature-sensor circuit that can reduce a voltage and have less noise while having high temperature sensitivity of an output voltage.

Further, in the temperature-sensor circuits as above, a variable supply that increases a voltage level as a temperature rises may be employed as a power supply. This has an advantage to improve temperature sensitivity as variation of the output voltage with respect to the temperature becomes large, in addition to a low voltage and less noise.

Further, in the temperature-sensor circuits as above, a resistance value of the second resistor or the fourth resistor being coupled with a power supply may be changeable.

This enables an output voltage of the temperature-sensor circuit to be adjusted as required to a compensated voltage generating circuit in a stage to be followed, in addition to a low voltage and less noise.

In the temperature-sensor circuits, the second resistor or the fourth resistor may be replaced by a current source. This can provide a temperature-sensor circuit that is not affected by variation of a power supply voltage, in addition to a low voltage and less noise.

Furthermore, a temperature compensated piezoelectric oscillator according to a third aspect of the invention includes: the temperature-sensor circuit according to the first or second aspect of the invention; and a temperature compensated voltage generating circuit generating a temperature compensated voltage based on a temperature detecting result of the temperature-sensor circuit.

In the temperature compensated piezoelectric oscillator having such a configuration, the temperature sensor with high sensitivity and causing less noise can suppress a gain of a compensated voltage circuit, thereby reducing a noise of a compensated voltage and improving a phase noise of the temperature compensated piezoelectric oscillator.

BRIEF DESCRIPTION OF THE DRAWINGS

The invention will be described with reference to the accompanying drawings, wherein like numbers reference like elements.

FIG. 1A is a circuit diagram showing a configuration of a temperature sensor according to a first embodiment of the invention.

FIG. 1B is a graph showing an output voltage characteristic.

FIG. 2 is a circuit diagram showing a configuration of a temperature sensor according to a second embodiment of the invention.

DESCRIPTION OF EXEMPLARY EMBODIMENTS

Embodiments of the invention will now be described with reference to the drawings.

FIG. 1A is a circuit diagram showing a configuration of a temperature sensor according to a first embodiment of the invention.

A temperature-sensor circuit 1 shown in FIG. 1A includes a transistor Tr1 and a series circuit in which a resistor R1 serving as a first resistor and a resistor R2 serving as a second resistor are coupled in series. An end of the resistor R1 in the series circuit is coupled with a collector of the transistor Tr1 while an end of the resistor R2 in the series circuit is coupled with a reference supply (reference voltage Vref). Further, a base of the transistor Tr1 is coupled with a junction joining the resistor R1 and the resistor R2 while an emitter of the transistor Tr1 is grounded.

In FIG. 1B, a temperature characteristic of a base-emitter voltage $V_{BE1}$ of the transistor Tr1 in the temperature-sensor circuit 1 shown in FIG. 1A is indicated in a dashed line, while an output voltage Vout is indicated in a full line. The output voltage Vout has a characteristic to decrease approximately linearly as a temperature (Temp) rises. Further, in the temperature-sensor circuit 1 according to the embodiment, the transistor Tr1 is used as a diode by coupling the junction joining the resistor R1 and the resistor R2 with the base of the transistor Tr1.

FIG. 2 is a circuit diagram showing a configuration of a temperature-sensor circuit according to a second embodiment.

A temperature-sensor circuit 2 includes a temperature sensor portion C1 and a temperature sensor portion C2. The temperature sensor portion C1 is configured similarly to the temperature-sensor circuit 1 shown in FIG. 1A. The temperature sensor portion C2 includes a transistor Tr2, and a series circuit including two resistors that are resistors R3 and R4. An end of the resistor R3 is coupled with a collector of the transistor Tr2, and the other end of the resistor R3 is coupled with a base, while an end of the resistor R4 is coupled with the other end of the resistor R3, and the other end of the resistor R4 is coupled with a reference supply (reference voltage Vref). Further, an output of the temperature sensor portion C1 is coupled with an emitter of the transistor Tr2 of the temperature sensor portion C2, so that an output is taken from the collector of the transistor Tr2.

Figure 3:
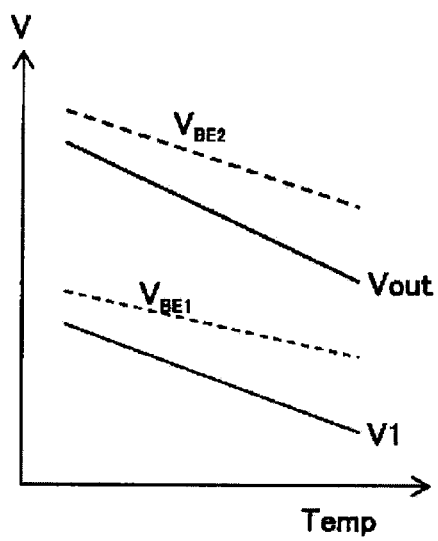
FIG. 3 is a graph showing an output voltage characteristic of the temperature sensor according to the second embodiment of the invention.

In FIG. 3, temperature characteristics of the base-emitter voltage $V_{BE1}$ of the transistor Tr1 and a base-emitter voltage $V_{BE2}$ of the transistor Tr2 in the temperature-sensor circuit 2 shown in FIG. 2 are respectively indicated in a dashed line, while the output voltage V1 of the temperature sensor portion C1 and an output voltage Vout of the temperature-sensor circuit 2 are respectively indicated in a full line. Here, when a collector current of the transistor Tr1 is defined as Ic, the output voltage V1 is indicated as $V1=V_{BE1}-R1 \times Ic$. According to FIG. 3, the output characteristic of the temperature-sensor circuit 2 shows sensitivity of a temperature sensor that increases to about twice as much as that of the output characteristic shown in FIG. 1B.

The temperature-sensor circuit 2 having such a configuration as above according to the second embodiment can improve the temperature sensitivity and reduce a voltage, while the output voltage Vout has a low noise level resulting from use of the base-emitter voltage of the transistor.

Here, an emitter current flowing through the transistor Tr2 flows to the corrector of the transistor Tr1. Therefore, even if the current flowing through the temperature sensor portion C2 varies in any way, the base-emitter voltage $V_{BE1}$ of the transistor Tr1 hardly varies. As a result, the output voltage V1 of the temperature sensor portion C1 can be hardly affected by variation of the temperature sensor portion C2. Therefore, the sensor circuit can have the temperature sensor portion C1 and the temperature sensor portion C2 that are independently designed.

Further, since the base-emitter voltage and the current flowing through the resistor in the temperature-sensor circuit 2 can respectively have a temperature characteristic, an output voltage having higher temperature sensitivity is obtained compared to the temperature-sensor circuit employing only a voltage in a forward direction of a diode in related art. Further, due to a voltage drop of the resistor R1, an operation point of the output voltage (output voltage value at a room temperature) can be set not to be high, resulting in an advantage in which an input voltage for a next stage circuit can be easy to be optimized. That is, the voltage at a room temperature can be set at an optimum point that is further from a saturation point. Therefore, utmost temperature sensitivity is obtained in a temperature range to be used without saturating the output voltage at either a high temperature or a low temperature.

Further, in the temperature-sensor circuit employing only a voltage in a forward direction of a diode in related art, an output voltage itself at a room temperature is required to be set high at a certain degree in order to obtain high temperature sensitivity. Therefore, it is impossible to improve the temperature sensitivity while reducing a voltage at the same time. Furthermore, in the second embodiment, the circuit configuration is made simple because an operational amplifier or the like is not used, thereby leading an advantage in which a chip area is reduced in size in an LSI configuration.

Figure 4:
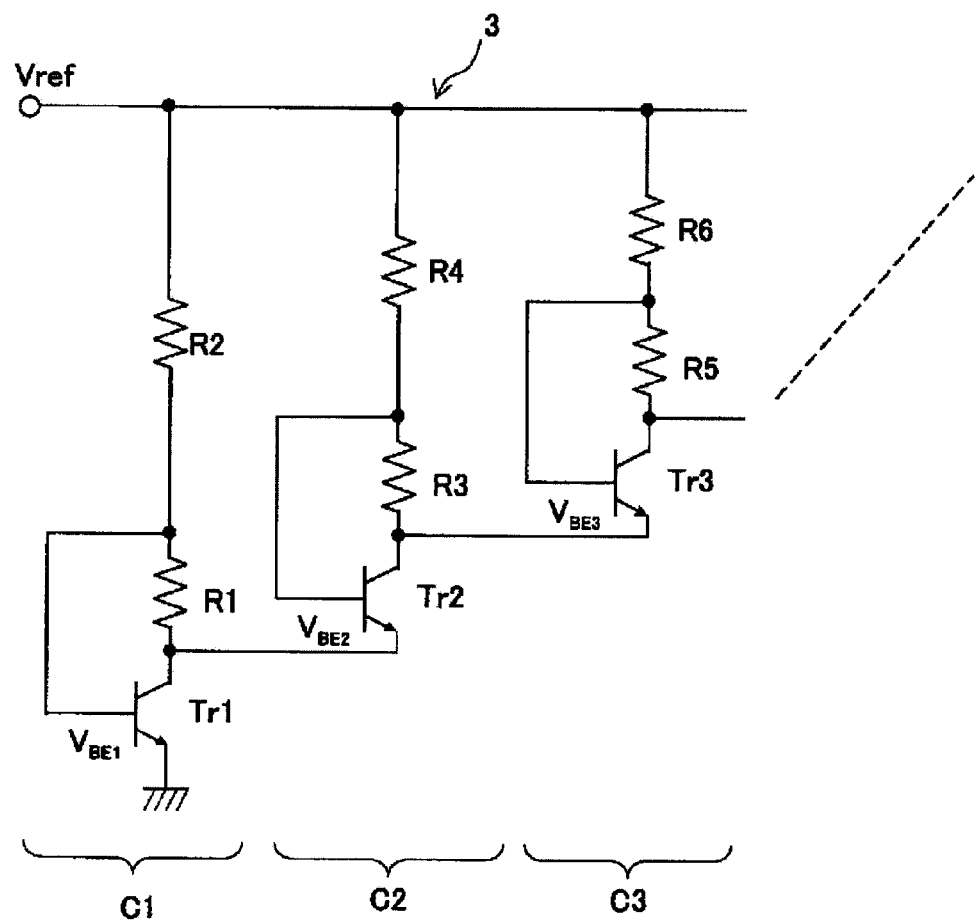
FIG. 4 is a circuit diagram showing a configuration of a temperature sensor according to a third embodiment of the invention.

FIG. 4 is a circuit diagram showing a configuration of a temperature-sensor circuit according to a third embodiment.

A temperature-sensor circuit 3 shown in FIG. 4 includes a plurality of temperature sensor portions C1, C2, C3, . . . , that are coupled in a cascade.

In the third embodiment, the output (collector) of the temperature sensor portion C1 is coupled with the emitter in the temperature sensor portion C2 serving as a second temperature sensor portion, and further, the collector in the temperature sensor portion C2 is coupled with an emitter in the temperature sensor portion C3 serving as a third temperature sensor portion. Similarly, a collector of a transistor in a (i−1)th temperature sensor portion Ci−1 (not illustrated) is sequentially coupled with an emitter of a transistor in a i-th temperature sensor portion Ci (not illustrated). Then, an output is taken from a collector of a transistor Trn (not illustrated) in a temperature sensor portion Cn (not illustrated) in a final stage (n-th). Here, the number of the temperature sensors coupled in a cascade is defined as n (n is an integer of two or more), while i indicates any integers satisfying 2≦i≦n.

In addition to the advantageous effect of the temperature-sensor circuit 2 according to the second embodiment, the temperature-sensor circuit 3 having such a configuration as above according to the third embodiment enables voltage reduction because sensitivity of the output voltage increases as the number of stages increases.

In the temperature-sensor circuits according to the embodiments described above, the reference voltage Vref is applied as a power supply voltage in order to operate the circuits as a high-precision temperature sensor. However, instead of the reference voltage Vref, the temperature-sensor circuits may be configured to apply a fixed voltage such as a power supply voltage Vcc. In this case, a reference-voltage generating circuit can be omitted, thereby simplifying the circuit configuration.

Figure 5A:
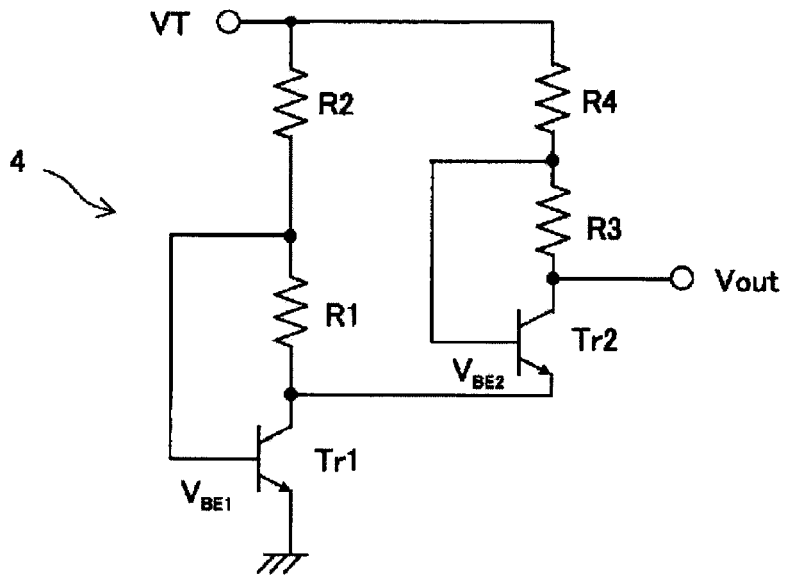
FIG. 5A is a circuit diagram showing a configuration of a temperature sensor according to a fourth embodiment of the invention.
Figure 5B:
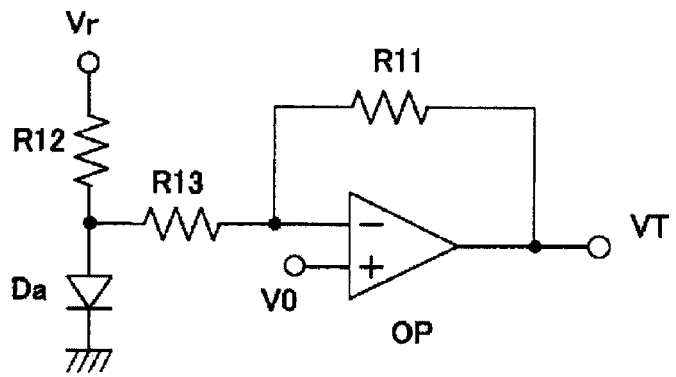
FIG. 5B is a circuit configuration diagram for outputting an applied voltage VT.

FIG. 5A is a circuit diagram showing a configuration of a temperature-sensor circuit according to a fourth embodiment of the invention. A temperature-sensor circuit 4 shown in FIG. 5A has a similar configuration to that of the temperature-sensor circuit 2 shown in FIG. 2. However, the configuration is different at a point in which a voltage VT that linearly increases as the temperature rises is employed to apply, instead of the reference voltage Vref. FIG. 5B is a diagram showing a circuit generating a voltage that linearly increases with respect to a temperature. In the circuit, a cathode side of a diode Da is grounded, while an anode side is coupled with a resistor R12, and the reference voltage Vr is applied. The anode side of the diode Da is coupled with an inverting terminal (−) of an operational amplifier OP through the resistor R13, while a voltage V0 is applied to a non-inverting terminal (+), and an output of the operational amplifier OP is coupled with the inverting terminal (−) through a resistor R11, thus forming the circuit.

Figure 5C:
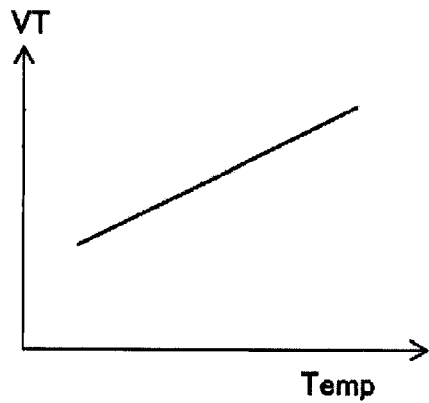
FIG. 5C is a graph showing a temperature characteristic of the applied voltage VT.

FIG. 5C is a graph showing a temperature characteristic of the output voltage VT shown in FIG. 5B. The voltage VT increases as a temperature rises.

The temperature-sensor circuit employs the voltage VT that linearly increases with respect to the temperature as described above, providing a temperature-sensor circuit having higher temperature sensitivity than the temperature-sensor circuit 2 shown in FIG. 2.

In the fourth embodiment, a temperature sensor portion having two stages is exemplified. However, a multistage circuit configuration can further improve temperature sensitivity.

Figure 6:
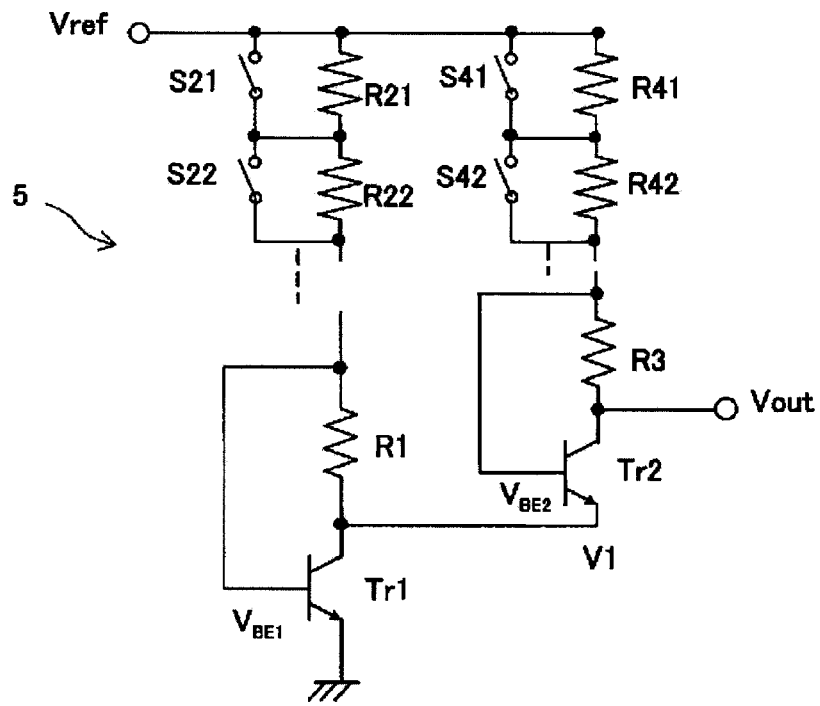
FIG. 6 is a circuit diagram showing a configuration of a temperature sensor according to a fifth embodiment of the invention.

FIG. 6 is a circuit diagram showing a configuration of a temperature sensor according to a fifth embodiment. A difference from the temperature-sensor circuit 2 shown in FIG. 2 is that a parallel circuit of a switch S21 and a resistor R21, a parallel circuit of a switch S22 and a resistor R22, and a parallel circuit of a switch S2$i$ (i=1 to n) and a resistor R2$i$ (i=1 to n) are sequentially coupled in series instead of the resistor R2 so as to enable a resistance value to be changeable. In addition, a parallel circuit of a switch S41 and a resistor R41, a parallel circuit of a switch S42 and a resistor R42, and a parallel circuit of a switch S4$i$ (i=1 to n) and a resistor R4$i$ (i=1 to n) are sequentially coupled in series instead of the resistor R4 so as to enable a resistance value to be changeable. The switches S2$i$ and S4$i$ (i=1 to n) can change a resistance value by appropriately turning ON or OFF based on a signal from a control circuit (memory circuit) that is not illustrated, thereby adjusting sensitivity of the temperature-sensor circuit to be optimum. When a current is applied after reducing a resistance value, the temperature sensitivity can be increased. Further, the switches S2$i$ and S4$i$ can be used as adjustors for an output voltage and temperature sensitivity.

In the fifth embodiment, a circuit having two stages is exemplified. However, a multistage circuit configuration can further improve temperature sensitivity.

Figure 7:
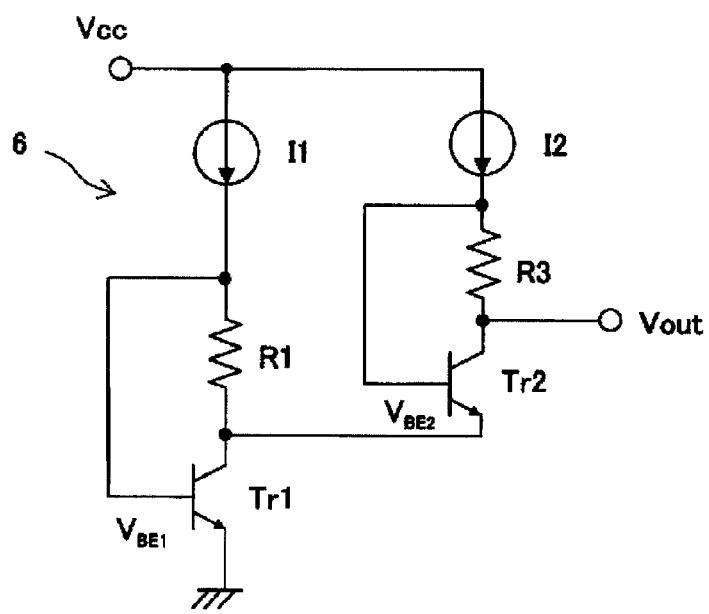
FIG. 7 is a circuit diagram showing a configuration of a temperature sensor according to a sixth embodiment of the invention.

FIG. 7 is a circuit diagram showing a configuration of a temperature-sensor circuit according to a sixth embodiment.

Differences from the circuit configuration of the temperature-sensor circuit 2 shown in FIG. 2 are that constant current sources I1 and I2 are employed instead of the resistors R2 and R4, and a power supply voltage Vcc is applied instead of the reference voltage Vref. Employing the constant current sources enables the temperature-sensor circuit not to be affected by variation of the power supply voltage, and further enables an operation with a low voltage.

In the sixth embodiment, a circuit having two stages is exemplified. However, a multistage circuit configuration can further improve temperature sensitivity.

Figure 8:
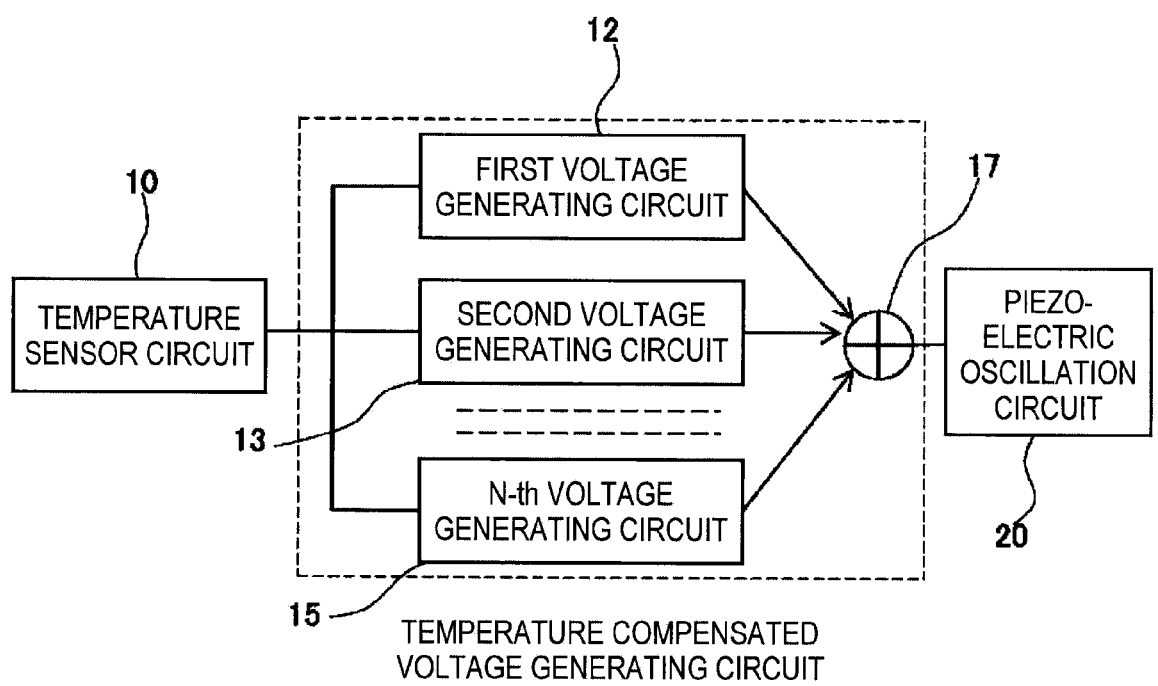
FIG. 8 is a functional block diagram showing a configuration of a temperature compensated piezoelectric oscillator.
Figure 9A:
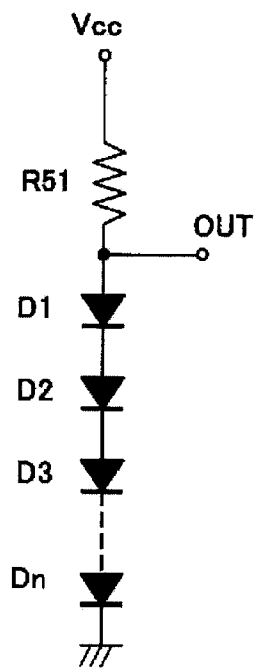
FIG. 9A is a diagram showing a temperature sensor in related art.
Figure 9B:
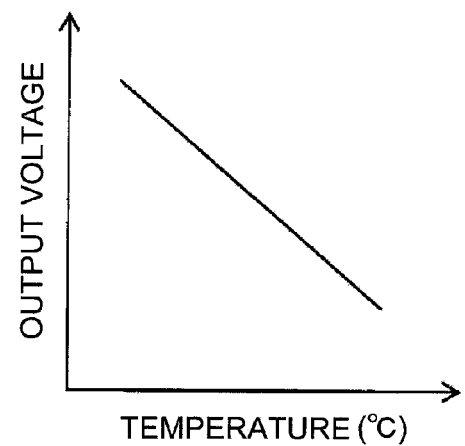
FIG. 9B shows an output voltage characteristic of the temperature sensor shown in FIG. 9A.
Figure 9C:
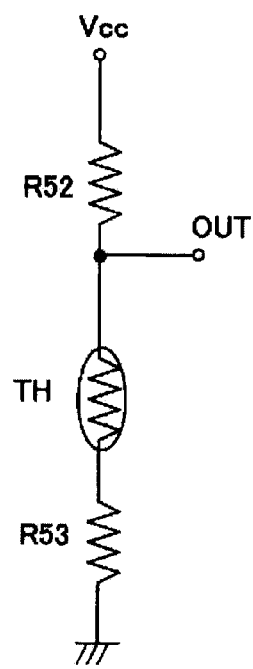
FIG. 9C is a diagram showing a configuration of another temperature sensor in related art.
Figure 9D:
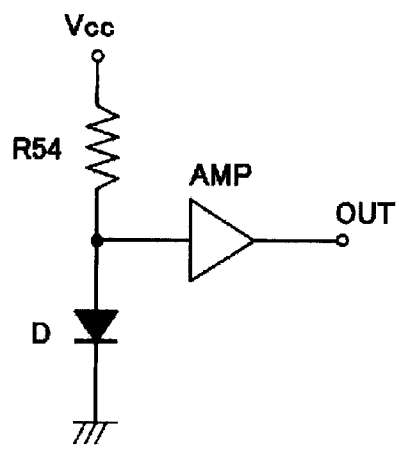
FIG. 9D is a diagram showing a configuration of yet another temperature sensor in related art.

FIG. 8 is a diagram showing a structure of a temperature compensated piezoelectric oscillator according to another embodiment.

The temperature compensated piezoelectric oscillator shown in FIG. 8 is provided with a temperature-sensor circuit 10 according to the embodiments above, a first voltage generating circuit 12, a second voltage generating circuit 13, a third voltage generating circuit, . . . , an n-th voltage generating circuit 15, a voltage adder 17, a piezoelectric oscillation circuit 20 and the like. The temperature compensated piezoelectric oscillator having such a structure according to the embodiment can operate with a low voltage resulting from employing the temperature-sensor circuit 10. Further, the temperature sensor with high sensitivity and having low noise can suppress a gain of a compensated voltage circuit, thereby reducing noise of a compensated voltage. That is, improvement in phase noise of an output of the temperature compensated piezoelectric oscillator is expected. For example, in a case of using a power supply voltage of about 1.8 V, in the configuration having two stages as shown in FIG. 2, an output voltage (center voltage of the temperature sensor) of the temperature sensor at 25 degrees Celsius is suitable for an input voltage of the compensated voltage circuit as it is a voltage to be easy to be controlled.

What is claimed is:

1. A temperature-sensor circuit, comprising:
  a first transistor having a first emitter that is grounded, a first collector, and a first base;
  a first resistor having a first end and a second end, the first end being coupled with the first collector;
  a second resistor having a third end and a fourth end, the third end being coupled with the second end of the first resistor;
  a second transistor having a second emitter that is coupled with the first collector, a second collector, and a second base;
  a third resistor having a fifth end and a sixth end, the fifth end being coupled with the second collector; and
  a fourth resistor having a seventh end and an eighth end, the seventh end being coupled with the sixth end of the third resistor, wherein a junction of the first resistor and the second resistor is coupled with the first base, while a junction of the third resistor and the fourth resistor is coupled with the second base, and the fourth end of the second resistor is coupled with the eighth end of the fourth resistor.

2. The temperature-sensor circuit according to claim 1, wherein the fourth end of the second resistor is coupled with a variable supply that increases a voltage level as a temperature rises.

3. The temperature-sensor circuit according to claim 1, wherein at least one of a resistance value of the second resistor and a resistance value of the fourth resistor is changeable.

4. A temperature compensated piezoelectric oscillator, comprising:
  the temperature-sensor circuit according to claim 1; and
  a temperature compensated voltage generating circuit generating a temperature compensated voltage based on a temperature detecting result of the temperature-sensor circuit.

5. A temperature-sensor circuit, comprising:
  a first transistor having a first emitter that is grounded, a first collector, and a first base;
  a first resistor having a first end and a second end, the first end being coupled with the first collector;
  a current source having a third end and a fourth end, the third end being coupled with the second end of the first resistor;
  a second transistor having a second emitter that is coupled with the first collector, a second collector, and a second base;
  a second resistor having a fifth end and a sixth end, the fifth end being coupled with the second collector; and
  a third resistor having a seventh end and an eighth end, the seventh end being coupled with the sixth end of the second resistor, wherein a junction of the first resistor and the current source is coupled with the first base, while a junction of the second resistor and the third resistor is coupled with the second base, and the fourth end of the current source is coupled with the eighth end of the third resistor.

6. A temperature-sensor circuit, comprising:
  a first transistor having a first emitter that is grounded, a first collector, and a first base;
  a first resistor having a first end and a second end, the first end being coupled with the first collector;
  a second resistor having a third end and a fourth end, the third end being coupled with the second end of the first resistor;
  a second transistor having a second emitter that is coupled with the first collector, a second collector, and a second base;
  a third resistor having a fifth end and a sixth end, the fifth end being coupled with the second collector; and
  a current source having a seventh end and an eighth end, the seventh end being coupled with the sixth end of the third resistor, wherein a junction of the first resistor and the second resistor is coupled with the first base, while a junction of the third resistor and the current source is coupled with the second base, and the fourth end of the second resistor is coupled with the eighth end of the current source.

* * * * *